United States Patent [19]

Nishibayashi et al.

[11] Patent Number: 5,500,393
[45] Date of Patent: Mar. 19, 1996

[54] METHOD FOR FABRICATING A SCHOTTKY JUNCTION

[75] Inventors: Yoshiki Nishibayashi; Hiromu Shiomi; Naoji Fujimori, all of Hyogo, Japan

[73] Assignee: Sumitomo Electric Industries, Ltd., Osaka, Japan

[21] Appl. No.: 184,105

[22] Filed: Jan. 21, 1994

Related U.S. Application Data

[63] Continuation-in-part of Ser. No. 908,570, Jun. 30, 1992, abandoned, which is a continuation of Ser. No. 702,498, May 20, 1991, abandoned.

[30] Foreign Application Priority Data

May 21, 1990 [JP] Japan ................................ 2-131591

[51] Int. Cl.$^6$ ................................................ H01L 21/28
[52] U.S. Cl. ..................... 437/175; 437/937; 437/946; 156/643.1; 134/1.2; 148/DIG. 17
[58] Field of Search ....................... 437/175, 946, 437/179, 178, 937; 156/643.1; 257/77; 734/1.1, 1.2; 148/DIG. 17

[56] References Cited

U.S. PATENT DOCUMENTS

| | | | |
|---|---|---|---|
| 4,373,166 | 2/1983 | Bergeron et al. | |
| 4,579,623 | 4/1986 | Suzuki et al. | 156/626 |
| 4,957,591 | 9/1990 | Sato et al. | 156/643 |
| 5,002,899 | 3/1991 | Geis et al. | 437/173 |
| 5,015,494 | 5/1991 | Yamazaki | 427/39 |
| 5,028,560 | 7/1991 | Tsukamoto et al. | 437/81 |
| 5,089,441 | 2/1992 | Moslehi | 437/225 |
| 5,135,807 | 8/1992 | Ito et al. | 428/334 |
| 5,350,944 | 9/1994 | Geis et al. | 257/77 |

FOREIGN PATENT DOCUMENTS

| | | | |
|---|---|---|---|
| 52-75183 | 6/1977 | Japan | 437/946 |
| 1-246867 | 10/1989 | Japan . | |

OTHER PUBLICATIONS

Gildenblat, G., et al., "Schottky Diodes with Thin film Diamond Base", IEEE IEDM Digest 1988, pp. 626–629.
Geis, M., et al., "High Temperature ..." IEEE Electron Dev. Lett., vol. EDL–8, No. 8, Aug. 1987, pp. 341–343.
Fujimori, N., et al., "Characterization of ... ", Vacuum, vol. 36, No. 1–3, 1986, pp. 99–102.
Shiomi et al., "Electrical Characteristics ... ", Japanese J. Appl. Phys., 28(5), May 1989, pp. 758–762.
Mori, Y., "Properties of Metal/Diamond ... ", Appl. Phys. Lett, 58(9), 4 Mar. 1991, pp. 940–941.

Primary Examiner—T. N. Quach
Attorney, Agent, or Firm—Cushman Darby & Cushman

[57] ABSTRACT

The characteristics of a Schottky junction between diamond and metal causes the diode using the Schottky junction to have a large leakage reverse current and n-value far bigger than 1. A surface of diamond on which a Schottky junction shall be formed is pretreated by oxygen plasma or halogen plasma. The oxygen plasma or hydrogen plasma improves the surface state of the diamond by decoupling the surface C—C bonds and endowing the resulting extra bonds with hydrogen atoms, normalizing the superlattice structure at the surface. Pretreatment of the diamond by the oxygen or halogen plasma improves the diode properties; decreasing reverse current, increasing forward current and decreasing the n-value nearer to 1.

15 Claims, 4 Drawing Sheets

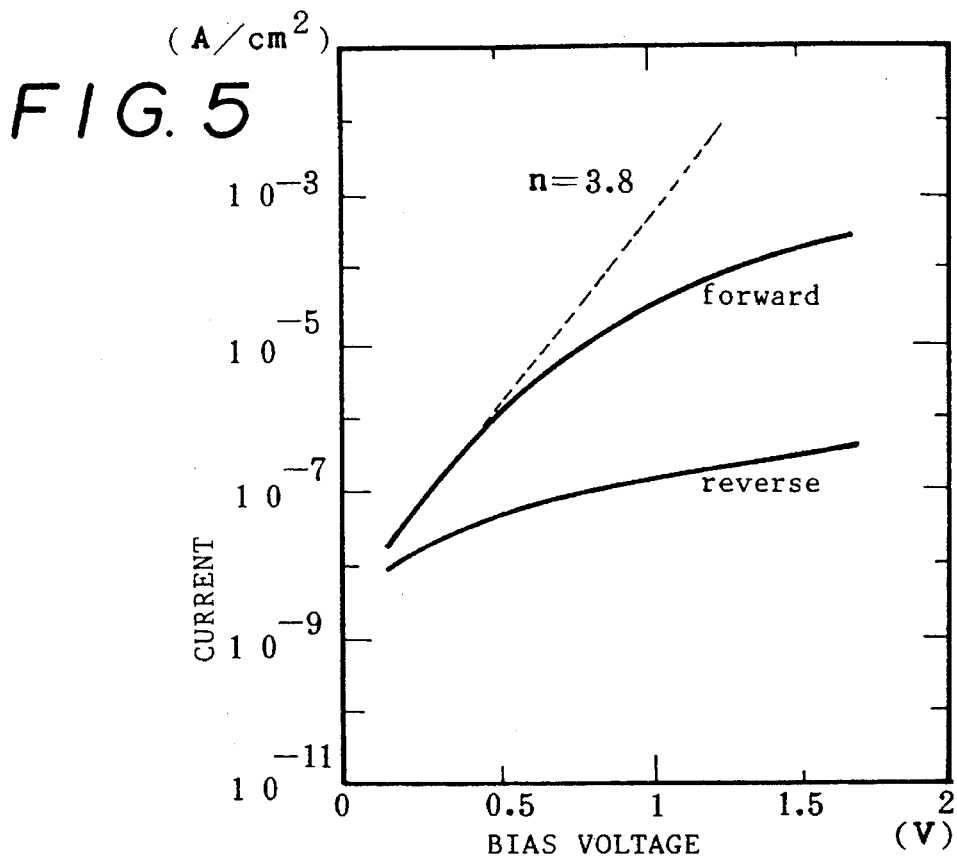
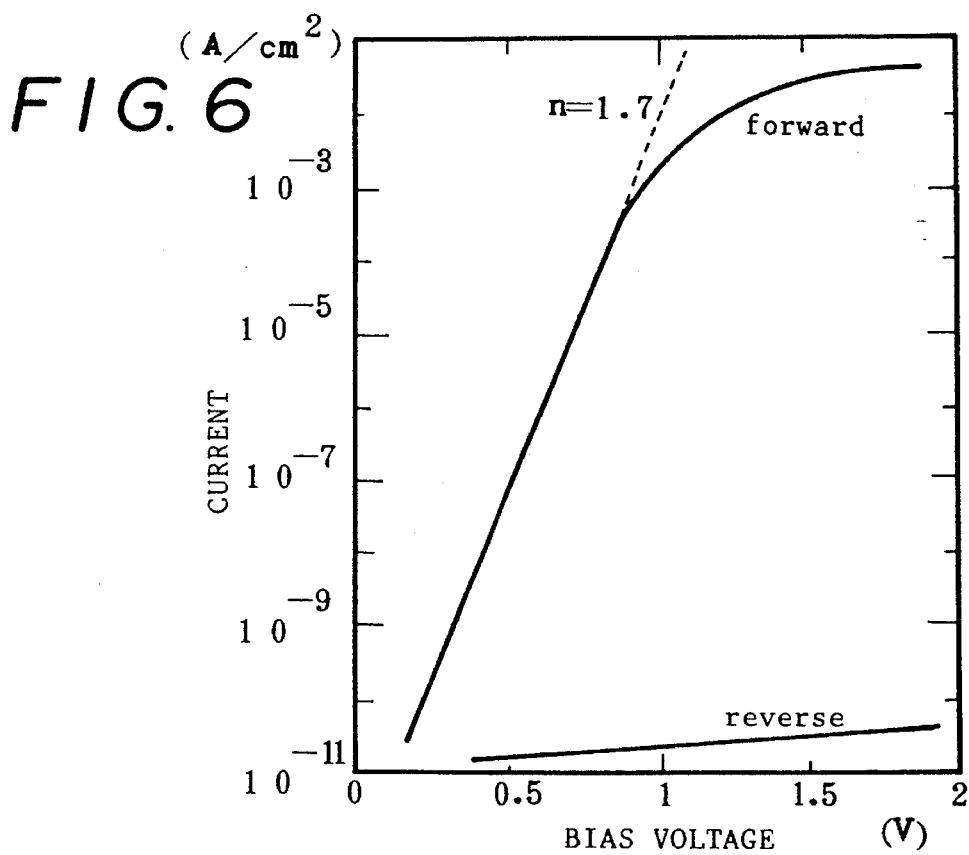

METHOD FOR FABRICATING A SCHOTTKY JUNCTION

RELATED APPLICATIONS

This is a continuation-in-part of application U.S. Ser. No. 07/908,570, filed Jun. 30, 1992, abandoned, which is a continuation of prior application U.S. Ser. No. 07/702,498, filed May 20, 1991, now abandoned.

FIELD OF THE INVENTION

This invention relates to a method for fabricating a Schottky junction which is applied to the diamond semiconductor devices, e.g. diodes, transistors, etc.

BACKGROUND OF THE INVENTION

Diamond semiconductor devices attract attention as devices which would work stably at high temperature or in rigorous surroundings, e.g. under the radiation of radioactive rays or devices which could generate high output power.

These properties of diamond semiconductor devices are attributable to thermal or chemical stability of diamond. Since pn junctions of diamond semiconductor are difficult to fabricate, Schottky junctions are often used instead of the pn junctions. Therefore, the formation of the Schottky junctions with ideal properties is one of the most important objects for the diamond semiconductor devices.

The quality of a Schottky junction is estimated by the diode properties. Namely, a good Schottky junction requires a small reverse current for a reverse bias voltage and the small voltage drop for the forward bias. Some trials for fabricating a Schottky junction of semiconductor diamond have been done.

M. W. Geis et al have reported a point contact type of a Schottky junction of diamond semiconductor; M. W. Geis et al, IEEE ELECTRON DEVICE LETTERS, vol. EDL8, (1987) p.341.

However, this Schottky junction had such a small contact area that it was inapplicable to high output power devices. Although the research of metal electrodes formed by evaporation coating has proceeded to improve the quality of Schottky junctions of diamond semiconductor, the method for fabricating a Schottky junction of good quality has not been established yet.

To estimate the quality of a Schottky junction, the reverse current calculated from the height of a barrier, and the n-value which appears in the denominator of an exponential function describing the relation between the applied voltage and the forward current are often used.

Here, the reverse current includes not only the ideal reverse current overflowing the Schottky barrier or flowing through the Schottky barrier by the quantum tunneling effect, but also the leakage current flowing due to the insufficiency of the Schottky junction or flowing by hopping on the defect levels existing in the band gap. The quality of a Schottky junction is estimated by the strength of the leakage current, because the leakage current depends on the insufficiencies or defects of the junction.

In the case of a Schottky junction between metal and diamond, if the height of the Schottky barrier between metal and semiconductor diamond is assumed to be about 1.8 eV, the ideal reverse current density (without leakage current) should be about $10^{-23}$ A/cm$^2$.

However, in practice, there are some leakage currents, which raises the reverse current density far above $10^{-23}$ A/cm$^2$. Current detectors do not have sensitivity sufficient to detect a small current density, e.g., less than $10^{-12}$ A/cm$^2$. If the leakage current density is more than the limit of detector sensitivity of $10^{-12}$ A/cm$^2$, the quality of the Schottky diode can be estimated by the actual leakage current, if the leakage current is smaller than $10^{-12}$ $^{A/cm2}$; the marginal sensitivity of current detectors, and thus quality of the Schottky diode cannot be measured in a quantitative way but rather the quality is objectively considerably good.

Theoretically, the forward current shall be expressed by exp( eV/nkT ), where e is the charge of an electron, k is the Boltzmann constant, T is the absolute temperature and V is the voltage applied to the Schottky junction. The "n" in the denominator of the index is the n-value mentioned. In the case of an ideal Schottky junction, n=1.

It was reported that the point contact type of Schottky junction had exhibited the reverse current density of $10^{-9}$ A/cm$^2$ to $10^{-6}$ A/cm$^2$ and the n-value of 2 to 10. The reverse current density was far bigger than the ideal reverse current density of $10^{-12}$ A/cm$^2$ (in the case of the barrier height of 1.8 eV) and also still bigger than the marginal current density of $10^{-12}$ A/cm$^2$ which a current detector can sense. Furthermore, the n-value differs from the ideal value to a degree.

The bad quality of the point contact type of Schottky junction of diamond semiconductor proceeds from the bad surface state of the diamond semiconductor. The properties of Schottky junctions are heavily affected by the surface state of the semiconductor. Since the Schottky junction is fabricated by evaporating a metal layer on a semiconductor diamond layer, not only the deposition of the metal layer but also the surface state of the semiconductor diamond layer are important factors deserving of full consideration.

The carbon atoms on the surface of diamond have some extra bonds which extend upward. In the case of the diamond which was synthesized by the CVD method, the extra bonds of the carbon atoms couple with the bonds of the neighboring carbon atoms or the bonds of hydrogen atoms. Thus, neighboring two carbon atoms are tightly coupled. The coupled carbon atoms are aligned in a periodic two-dimensional order on the surface. The periodicity of the surface carbon atoms is twice as long as that of the periodicity of crystal. Although a carbon atom on the surface has two neighboring carbon atoms, it couples with one of the two atoms by the extra bonds. The coupling by the extra bonds brings about an anisotropy on the surface structure. If metal electrodes are deposited on the diamond surface to make a Schottky junction, the quality of the Schottky junction is not good because of the bad surface state of the diamond.

A purpose of this invention is to provide a Schottky junction of diamond semiconductor with low reverse current less than $10^{-13}$ A/cm$^2$ ( the limit of sensitivity of current detectors) and with an n-value of 1 to 2.

SUMMARY OF THE INVENTION

The method of this invention comprises steps of etching a diamond surface by plasma gas containing reactive elements, e.g. oxygen, chlorine, fluorine or other halogen gas and depositing metal electrodes on the etched diamond surface.

Namely, this invention proposes an etching process by plasma gas containing oxygen, fluorine, chlorine or other halogen gas before the formation of the Schottky electrodes in order to improve the surface state of the diamond.

Oxygen atoms are introduced into the etching gas in the form of molecules, e.g. oxygen molecules ($O_2$), water($H_2O$), carbon dioxide ($CO_2$), chlorine or fluorine is introduced into the gas in the form of molecules, e.g. $CCl_4$, HCl, $CF_4$ or HF.

In order to generate plasma, any ion source can be employed. For example, a bucket type ion source which excites a material gas into plasma by an arc discharge of direct current between a cathode filament and an anode chamber, can be used in this invention. Other ion sources which excite a material gas by radio frequency discharge or by a direct-current discharge are also applicable to generate the plasma of oxygen, chlorine, fluorine or other halogen gas.

Besides oxygen or halogen gases, hydrogen or rare gases may mix with the etching gas to heighten the quality of the etched surface of diamond. Especially, a mixture gas of hydrogen and oxygen is preferable for the etching process.

In a plasma gas including oxygen or halogen gases, the surface is etched both by the chemical reactions and by the physical bombardments. The surface is etched by placing the diamond semiconductor in the plasma. Alternatively, the plasma is converted into ions and the ions are accelerated to bombard a diamond target.

This etching process is effective even at room temperature. Because diamond has a strong heat resistance, the diamond semiconductor can be safely heated up to 1000° C. Thus, the diamond semiconductors can be etched by the plasma gas at an arbitrary temperature between room temperature and 1000° C. Since the process time and the temperature are in a complementary relationship with each other, higher process temperature saves us more process time. The low process temperature will require a longer time to obtain the same effect.

Now, the reason why this invention is effective to make a Schottky junction of good quality will be explained, although we have not attained a full understanding of the mechanism of the pretreatment; etching by the plasma gas including oxygen or halogen.

On the surface of diamond, carbon atoms are arranged longitudinally and latitudinally. Each atom couples with two inner neighboring carbon atoms by its two bonds. Since a carbon atom has four bonds, two bonds of the carbon atom on the surface are left uncoupled with the inner carbon atoms. Since an uncoupled bond raises the energy of the atom, the atomic state with an uncoupled bond is very unstable.

To reduce the energy of the atom, the two extra bonds will substantially couple with the extra bonds of other carbon atoms on the surface. But the distance between the two neighboring atoms on the surface is $\sqrt{8}/\sqrt{3}$ times as long as the distance (C—C) between the two neighboring atoms in the crystal. The imaginary C—C bond on the surface would have higher energy than the C—C bond in the crystal. To decrease the bond energy further, one of the bonds will shrink, and the other will expand.

The shrinkage of the bond decreases the energy but the expansion of the bond increases the energy. Since the decrease of energy prevails over the increase of energy, the deformed bond state is more stable than the undeformed bond state. By this deformation, the carbon atoms on the surface deviate from the crystallographical, standard positions. The deviation of carbon atoms looks like waves on a microscopic scale. The periodic regular lattice structure vanishes from the surface of diamond.

If a metal electrode is coated on the diamond surface having the irregular lattice structure, the metal atoms will transcribe the irregularity of the diamond. Thus, the interface of the metal atoms and the carbon atoms is out of order. The metal atoms in several atomic layers also deviate from the crystallographical, standard points, because of the irregularity of the carbon atoms and the misfit of lattice constants between the metal and diamond. The disorder of the metal and diamond at the interface originates a lot of defect levels which will induce the hopping conduction through the defect levels.

Thus, inventors have been trying to improve the surface of diamond by bombarding the surface with plasma including various atoms.

For example, hydrogen gas is always used to synthesize diamond thin films by most CVD methods as a carrier gas. Pretreatment of the CVD-grown diamond by hydrogen plasma had turned out not to improve the surface state of diamond.

This inventors discovered that the pretreatment by oxygen plasma or halogen gas plasma is effective to improve the quality of Schottky junction. The reason why the pretreatment improves the Schottky junction has not been clarified yet by the inventors. However, the following processes would be surmised as the reason of the improvement. In the pretreatment of the diamond by hydrogen or halogen gas plasma, since oxygen plasma (including oxygen ions, neutral oxygen radicals and electrons) or halogen gas plasma strikes the surface of diamond, oxygen atoms or halogen atoms will couple with the carbon atoms in the most outer atomic layer by the extra bonds which have coupled the carbon atom to the neighboring carbon atom before the pretreatment.

The pair of carbon atoms which have been connected by their extra bonds will dissociate themselves by coupling to an oxygen or a halogen atom. The disorder of the lattice structure on the most outer atomic layer will be alleviated by the dissociation of the lattice near the surface. The band structure of the diamond near the most outer atomic layer will be reformed. Then, the parasitic levels due to the lattice deformation will decrease, which will lead to the decrease of leakage current at the reverse bias.

There may be another problem why the pretreatment by hydrogen gases is useless, while the pretreatment by oxygen or halogen gases is effective to decrease the leakage current and the n-value. What feature of oxygen or halogen gases distinguishes itself from hydrogen gas? To investigate the differences of the functions of the gases on the diamond semiconductor, the surface structures of the diamond treated by hydrogen gas and the diamond treated by oxygen gas were investigated by the RHEED (Reflective High Energy Electron Diffraction).

FIG. 7 is the RHEED pattern of the diamond sample treated by hydrogen gas plasma.

FIG. 8 is the RHEED pattern of the diamond sample treated by oxygen gas plasma.

The pattern of the hydrogen-treated diamond sample has twice as many parallel vertical lines as that of the oxygen-treated diamond. This means that the hydrogen-treated diamond has a superlattice structure whose periodicity is twice as long as that of the normal lattice structure. On the contrary, the oxygen-treated diamond does not have such a superlattice structure. The RHEED patterns show the conspicuous difference regarding the lattice structures between the hydrogen-treated diamond and the oxygen-treated diamond. However, the inventors have not clarified yet how the difference of the lattice structures will make influence upon the properties of Schottky junctions. Although the reason has not been clarified, it has been found by the inventors that the treatment by oxygen plasma or halogen plasma improves the properties of Schottky junctions of semiconductor diamond.

The mentioned above relates to the description inherent functions of the invention. In addition, general advantages of semiconductor diamond will now be explained. This invention can fully utilize the inherent properties of diamond, since a Schottky junction of good quality can be obtained.

Diamond has a wide band gap (5.5 eV). Thus, the intrinsic region does not exist below 1400° C., where diamond is thermally stable. The intrinsic semiconductor means that the hole concentration and the electron concentration are substantially equal, wherein the difference between the majority carrier and the minority carrier vanishes. Thus, intrinsic semiconductors cannot act as electronic devices, because the majority carriers cannot be controlled by electric fields. Unlike silicon or gallium arsenide, a diamond semiconductor will work well at high temperature because of the wide band gap.

Since diamond is chemically very stable, a diamond semiconductor will work under a severe atmosphere, e.g. in acid, alkali or other corrosive materials.

The thermal diffusivity of diamond is 20 W/cm K, which is more than ten times as much as that of silicon. Because of the large diffusivity, diamond semiconductor will be most suitable for large output power devices.

Furthermore, diamond is favored with high carrier mobilities; electron mobility is 2000 cm$^2$/V sec and hole mobility is 2100 cm$^2$/V sec at 300° C., with a small dielectric constant ($\epsilon$=5.5) and a big breakdown voltage ($E_b$=5×10$^6$ V/cm ). Thus, a high power device which works at the microwave region will be produced by the diamond semiconductor.

In addition, since a diamond with no impurities is an insulator, active diamond layers doped with a p-type dopant or an n-type dopant can be electrically separated from an insulating diamond substrate on which the active layers are grown without special isolation layers unlike silicon semiconductor devices.

Although semiconductor diamond has such advantages, the semiconductor devices using diamond would not work, if they do not have good Schottky junctions. Thus, this invention enables us to make excellent diamond devices which act at high temperatures with high output powers in the microwave region under a corrosive atmosphere by giving the diamond device a good Schottky junction.

This invention can be applied to natural diamond bulk monocrystals, synthesized (ultra high pressure method) diamond bulk monocrystals, the CVD-grown polycrystalline diamond films or the CVD-grown monocrystalline diamond films.

Diamond films can be synthesized by any of the CVD methods:

(1) activating the material gas by an electric discharge induced by a direct-current electric field or an alternate-current electric field, (2) activating the material gas by heating an thermal electron emitter (i.e. cathode filaments), (3) bombarding the surface of a substrate by the ions containing carbon atoms, (4) exciting the material gas by a laser light or ultraviolet light, and (5) burning the material gas.

The pretreatment of this invention is applicable to all the diamond films which are produced by the methods (1) to (5).

The advantages of this invention will be described. This invention enables us to make Schottky junctions of good quality. The diamond semiconductor devices, e.g. translators or diodes, having high heat resistance and high corrosion resistance can be fabricated by the Schottky junctions. The semiconductor devices of this invention take advantage of all the excellent properties of diamond.

BRIEF DESCRIPTION OF THE DRAWINGS

FIG. 5 is a graph of the voltage-current property of the diode as shown in FIG. 4 having a diamond film without the pretreatment of this invention.

FIG. 6 is a graph of the voltage-current property of the diode as shown in FIG. 4 having a diamond film with the pretreatment of this invention.

DETAILED DESCRIPTION OF THE EMBODIMENTS

EMBODIMENT 1

A diamond film (2) was grown on a synthesized diamond ( Ib ) monocrystal substrate (1) by the microwave plasma CVD method under the conditions;

| material gas | $H_2$, $CH_4$, $B_2H_6$ | |
| --- | --- | --- |
| | $H_2$ | 100 sccm |
| | $CH_4$ | 6 sccm |
| | $B_2H_6$(10 ppm in $H_2$) | 5 sccm |
| pressure | 40 Torr | |
| microwave power | 300 W | |
| time of discharge | 2 h | |

The diamond film was grown about to 500 nm in thickness on the (100) diamond substrate. It was confirmed by the electron diffraction method that the diamond film had epitaxially grown in the direction (100) in coincidence with the substrate.

A sample (a) was fabricated by depositing aluminum electrodes (3) on the diamond film without pretreatment by the evaporation coating under the pressure of 1×10$^{-6}$ Torr.

Another sample (b) was fabricated by pretreating the diamond film by oxygen plasma and depositing aluminum electrodes (3) on the pretreated diamond film by the evaporation coating under 1×10$^6$ Torr. The conditions of the pretreatment by the oxygen plasma were;

| | |
|---|---|
| treatment gas | $H_2$, $O_2$ |
| | $H_2$ 100 sccm |
| | $O_2$ 1 sccm |
| pressure | 40 Torr |
| microwave power | 300 W |
| time of discharge | 0.5 h |

Figure 1:
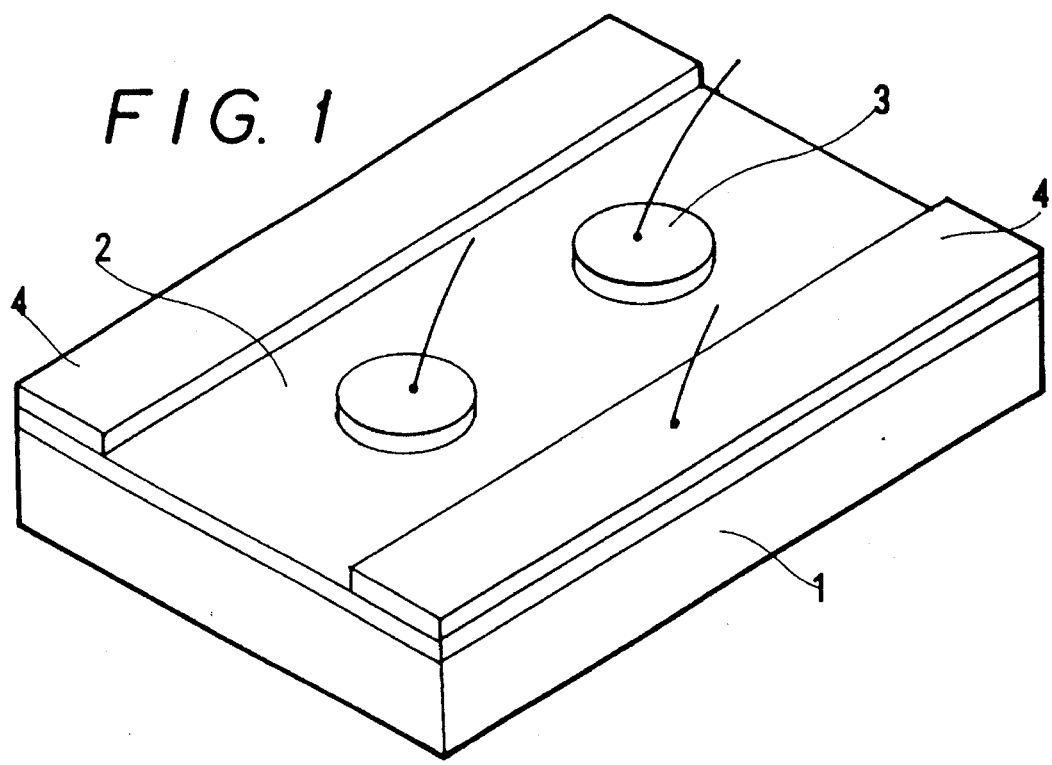
FIG. 1 is a schematical perspective view of a diode having a diamond film, being fabricated in order to examine the effects brought about by this invention.

Then ohmic titanium electrodes (4) were deposited on the diamond films (2) of the sample (a) and the sample (b). FIG. 1 shows the sample (a) or (b). An epitaxially grown diamond film (2) is grown on the monocrystalline diamond substrate (1). Stripe titanium electrodes (ohmic contact) (4) are deposited on both sides of the diamond film (2) and round aluminum electrodes (Schottky contact) (3) are deposited on the center of the diamond film (2).

Figure 2:
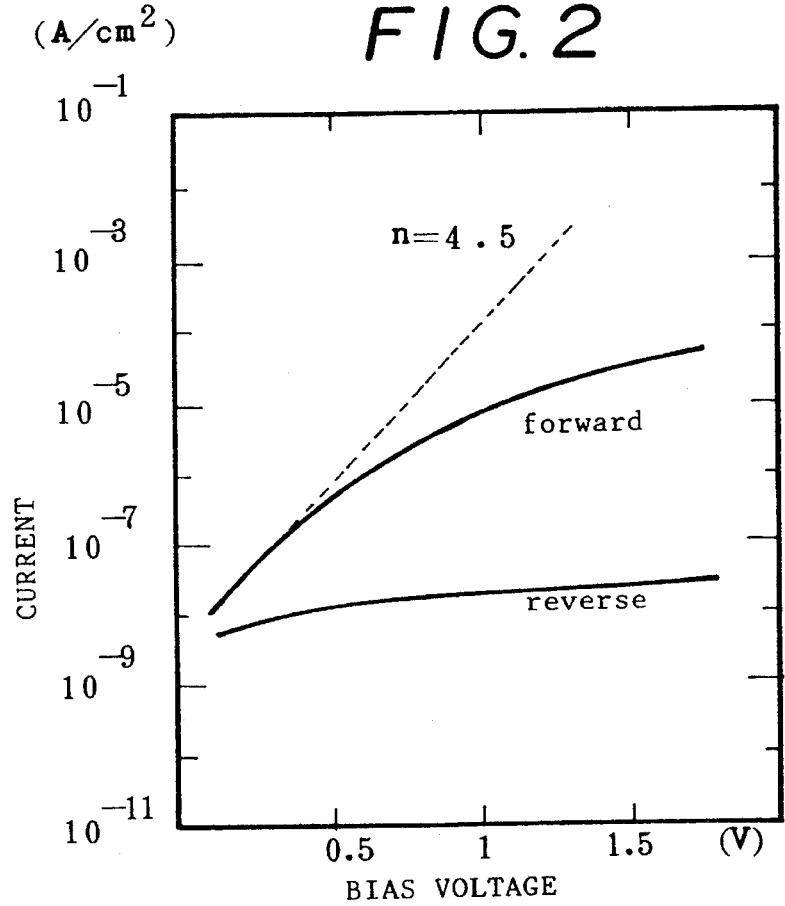
FIG. 2 is a graph of the voltage-current property of the diode as shown in FIG. 1, having a diamond film without the pretreatment of this invention; the abscissa denotes the voltage and the ordinate denotes the current.
Figure 3:
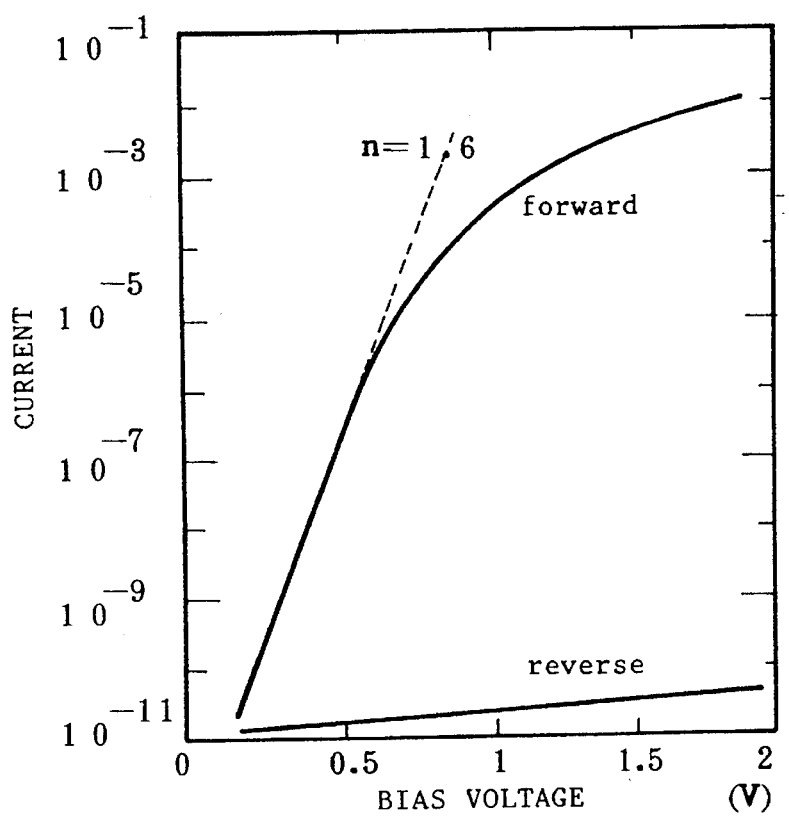
FIG. 3 is a graph of the voltage-current property of the diode as shown in FIG. 1, having a diamond film with the pretreatment of this invention.
Figure 7:
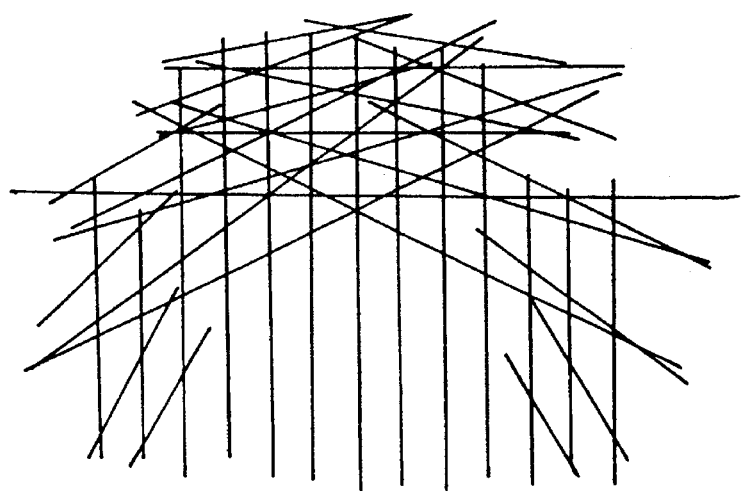
FIG. 7 is an RHEED (Reflective High Energy Electron Diffraction) pattern of the diamond pretreated by hydrogen plasma.
Figure 8:
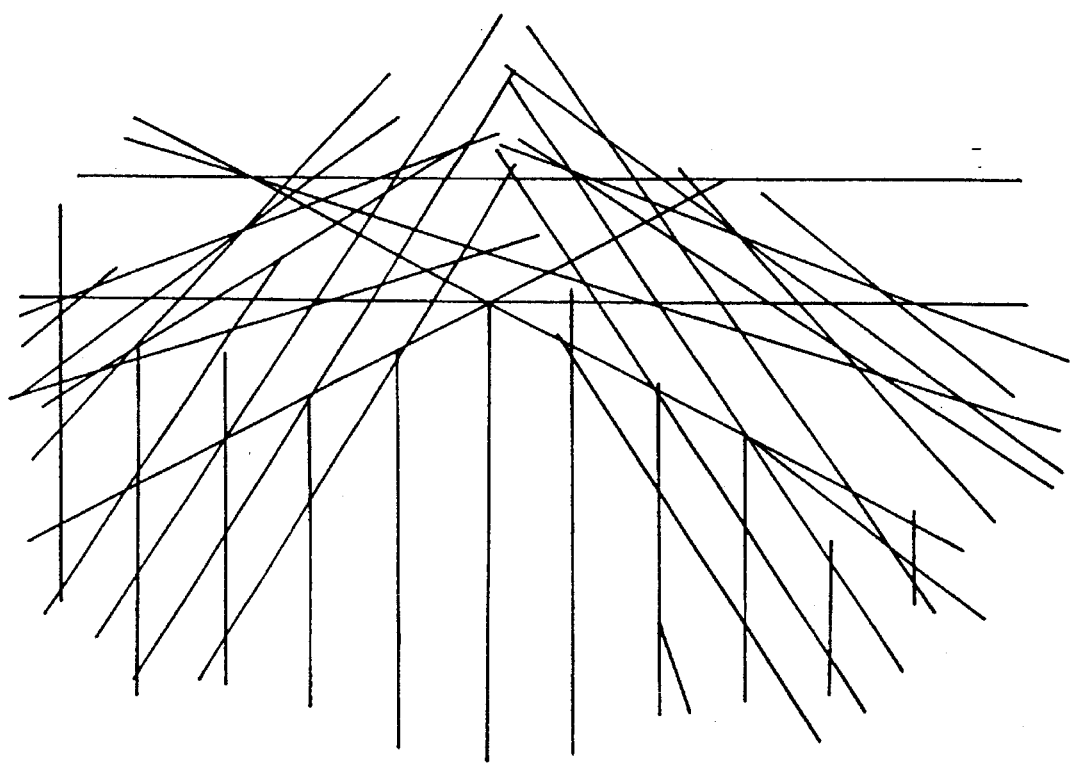
FIG. 8 is an RHEED pattern of the diamond pretreated by oxygen plasma.

FIG. 2 shows the voltage-current property of the sample (a) with the diamond film not pretreated. FIG. 3 shows the voltage-current property of the sample (b) with the pretreated diamond film. The abscissa denotes the voltage (1) applied between (3) and (4). The ordinate denotes the current density ($A/cm^2$). In the figures, the upper curves show the relation of the forward voltage and the forward current, and the lower curves show the relation of the reverse voltage and the reverse current. Although the reverse voltage and the reverse current are negative values, the relation of the reverse voltage-current relation is also in the same region of the graph for simplicity.

The reverse current reaches $10^{-7}$ $A/cm^2$ to $10^{-6}$ $A/cm^2$ for big voltage in the sample (a) with the diamond film not being pretreated. The forward resistance is big. The forward current will be saturated at low voltage. The n-value determining the diode property of the sample(a)is nearly 4.5.

On the contrary, the sample (b) being pretreated according to this invention has very little reverse current, i.e. $10^{11}$ to $10^{10}$ $A/cm^2$ and a big forward current. The n-value of the diode property of the sample (b) is nearly 1.6. There is a big difference between the forward current and the reverse current at the same voltage.

Therefore, the sample (b) with a pretreated diamond film exhibited far better diode properties than the sample (a) with a diamond film not pretreated. The reverse current of the sample (b) was as little as the marginal value ($10^{-12}$ $A/cm^2$) which the best current sensor can measure. The n-value (n=1.6) was very akin to the ideal n-value (n=1).

In the embodiment 1, the oxygen flow in the treatment gas was 1 sccm. In order to examine the effect of changing the oxygen flow, the oxygen flow was changed from 0.1 sccm to 10 sccm. The same diode properties were obtained at any value of the oxygen flow between 0.1 sccm and 10 sccm.

Instead of oxygen plasma, halogen plasma, e.g. chlorine plasma induced by doping hydrogen chlorate (HCl) gas or fluorine plasma induced by doping carbon tetrafluoride ($CF^4$), was also effective to improve the diode properties of the Schottky function.

EMBODIMENT 2

Two bulk diamond monocrystals ($II_b$) of 2 mm×1.5 mm×0.3 mm synthesized by the ultra high pressure method were used as the active part of a diode. No diamond film was deposited on the monocrystals. One (b) of the diamond monocrystals was pretreated by oxygen plasma under the conditions like in the embodiment 1;

| | |
|---|---|
| treatment gas | $H_2$, $O_2$ |
| | $H_2$ 100 sccm |
| | $O_2$ 1 sccm |
| pressure | 40 Torr |
| microwave power | 300 W |
| time of discharge | 0.5 h |

Another(a) of the diamond monocrystals was not pretreated.

Figure 4:
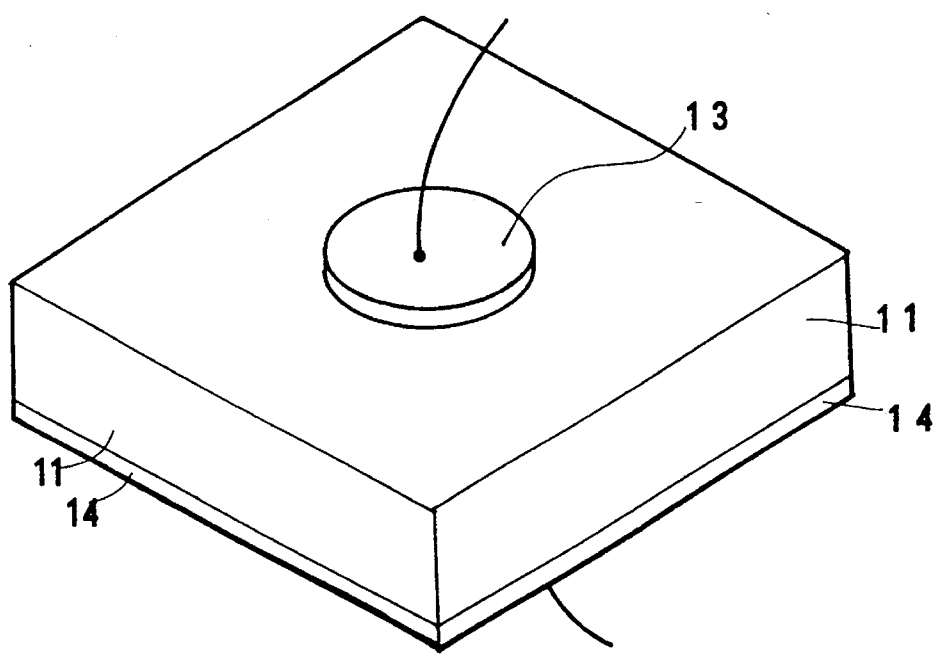
FIG. 4 is a schematic perspective view of a diode having a bulk diamond monocrystal being fabricated to examine the effects brought about by this invention.

Round, aluminum, Schottky electrodes were deposited on one surface of the monocrystals (a) and (b). Rectangular, titanium, ohmic electrodes were deposited overall on the other surface of the monocrystals (a) and (b). FIG. 4 shows the sample (a) or (b). The bulk diamond monocrystal (11) has a titanium electrode (14) on the bottom surface and an aluminum electrode (13) on the upper surface.

The voltage-current properties of the diodes are shown in FIG. 5 (sample (a) not treated) and in FIG. 6 (sample (b) treated). The sample (a) not being treated had a big reverse current, which will reach to $10^{-6}$ $A/cm^2$ to $10^{-7}$ $A/cm^2$ at high reverse voltage (not shown in FIG. 5). The forward current was small and was saturated at low voltage. The n-value qualifying the diode property was 3.8. The sample (a) was not a good diode.

The sample (b) being treated according to this invention had a very low reverse current, which is $10^{-11}$ $A/cm^2$ to $10^{-10}$ $A/cm^2$ and a sufficiently big forward current. The n-value was 1.7. The sample (b) was an excellent diode.

EMBODIMENT 3

Diamond films are deposited on (100) monocrystal diamond substrates (Ib) by the microwave plasma CVD method under the conditions.

| | |
|---|---|
| $H_2$ flux: | 100 sccm |
| $CH_4$ flux: | 6 sccm |
| $B_2H_6$ (10 ppm in $H_2$) flux: | 5 sccm |
| Pressure: | 40 Torr |
| Microwave Power: | 300 W |
| Time of deposition | 2 hours |

The diamond films are pretreated by the conditions of Table 1. Then samples shown in FIG. 1 are fabricated by evaporating titanium (Ti) as ohmic electrodes and by evaporating aluminum (Al) as Schottky electrodes. RHEED indicates that the diamond has been deposited epitaxially on the substrate.

The properties of the Al-Schottky junctions are tested by letting currents in a forward direction or in a reverse direction.

TABLE 1

| surface treatment | | forward current (at 5V) | reverse current (at 5V) | n-value |
|---|---|---|---|---|
| none | | $1 \times 10^{-3}$ | $1 \times 10^{-7}$ | 4.5 |
| hydrogen (SCCM) | oxygen (SCCM) | | | |
| 100 | 0 | $1 \times 10^{-3}$ | $1 \times 10^{-7}$ | 4.5 |
| 100 | 0.1 | $1.5 \times 10^{-2}$ | $1 \times 10^{-10}$ | 1.8 |
| 100 | 1 | $1 \times 10^{-2}$ | $3 \times 10^{-11}$ | 1.6 |
| 100 | 10 | $5 \times 10^{-3}$ | $2 \times 10^{-11}$ | 1.5 |
| 100 | 20 | * | * | * |

*the surface of the sample is rugged.

Other conditions of the pretreatment of the surface are as follows:

TABLE 2 surface treatment

| hydrogen (SCCM) | oxygen (SCCM) | forward current (at 5V) | reverse current (at 5V) | n-value |
|---|---|---|---|---|
| 10 | 0.1 | $1 \times 10^{-2}$ | $3 \times 10^{-11}$ | 1.5 |
| 100 | 1 | $1 \times 10^{-2}$ | $3 \times 10^{-11}$ | 1.6 |
| 500 | 5 | $0.8 \times 10^{-2}$ | $4 \times 10^{-11}$ | 1.6 |
| 1000 | 10 | $0.7 \times 10^{-2}$ | $4 \times 10^{-11}$ | 1.5 |

Other conditions of the pretreatment of the surface are as follows:

Pressure: 40 Torr

Microwave power: 300 W

Time of pretreatment: 30 min

TABLE 3

| surface treatment | | forward current (at 5V) | reverse current (at 5V) | n-value |
|---|---|---|---|---|
| hydrogen (SCCM) | $CF_4$ (SCCM) | | | |
| 100 | 1 | $2 \times 10^{-3}$ | $5 \times 10^{-11}$ | 1.5 |
| 100 | 0.1 | $5 \times 10^{-3}$ | $3 \times 10^{-11}$ | 17 |
| 100 | 10 | $8 \times 10^{-3}$ | $1 \times 10^{-11}$ | 1.7 |
| 500 | 50 | $5 \times 10^{-3}$ | $5 \times 10^{-11}$ | 1.6 |
| hydrogen (SCCM) | $Cl_2$ (SCCM) | | | |
| 100 | 1 | $5 \times 10^{-3}$ | $3 \times 10^{-11}$ | 1.6 |
| 100 | 0.1 | $6 \times 10^{-3}$ | $2 \times 10^{-11}$ | 1.5 |
| 100 | 10 | $5 \times 10^{-3}$ | $5 \times 10^{-11}$ | 1.5 |
| 500 | 50 | $5 \times 10^{-3}$ | $3 \times 10^{-11}$ | 1.6 |

An ideal Schottky junction will have a smaller reverse current, a larger forward current and an n-value near 1. Hydrogen plasma treatment without oxygen results in poor rectifying properties: big reverse current and weak forward current and high n-value. Hydrogen plasma treatment with oxygen of 0.1% to 10% brings about fruitful results: big forward current, small reverse current and low n-value near to 1. Table 3 discloses that the doping of halogen to hydrogen plasma is also advantageous for improving the rectifying property of Schottky junctions. Optimum ratios of halogen to hydrogen are also from 0.1% to 10%.

While the invention has been particularly shown and described with reference to preferred embodiments and alterations thereto, it should be understood by those skilled in the art that various changes in form and detail may be made therein without departing from the spirit and scope of the invention.

What is claimed is:

1. A method for fabricating a Schottky junction comprising diamond and a metal layer deposited directly on the diamond, the method comprising the steps of:

producing a halogen plasma by exciting a gas comprising one of $CCl_4$ and HCl;

pretreating a surface of the diamond with the halogen plasma to change an original superlattice structure of the surface of the diamond to a normal lattice structure, the original superlattice structure having a first periodicity twice as long as a second periodicity of the normal lattice structure; and depositing the metal layer directly on the pretreated surface of the diamond to form the Schottky junction.

2. The method according to claim 1, wherein the step of pretreating the surface of the diamond includes steps of:

breaking carbon bonds at the surface of the diamond to create dangling bonds; and adding hydrogen atoms to the dangling bonds.

3. A method for fabricating a Schottky junction comprising diamond and a metal layer deposited directly on the diamond, the method comprising the steps of:

producing a halogen plasma by exciting a gas comprising HF;

pretreating a surface of the diamond with the halogen plasma to change an original superlattice structure of the surface of the diamond to a normal lattice structure, the original superlattice structure having a first periodicity twice as long as a second periodicity of the normal lattice structure; and depositing the metal layer directly on the pretreated surface of the diamond to form the Schottky junction.

4. The method according to claim 3, wherein the step of pretreating the surface of the diamond includes steps of:

breaking carbon bonds at the surface of the diamond to create dangling bonds; and adding hydrogen atoms to the dangling bonds.

5. A method for fabricating a Schottky junction comprising diamond and a metal layer deposited directly on the diamond, the method comprising the steps of:

producing a halogen plasma by exciting a gas comprising $H_2$ and HCl;

pretreating a surface of the diamond with the halogen plasma to change an original superlattice structure of the surface of the diamond to a normal lattice structure, the original superlattice structure having a first periodicity twice as long as a second periodicity of the normal lattice structure; and depositing the metal layer directly on the pretreated surface of the diamond to form the Schottky junction.

6. The method according to claim 5, wherein the step of pretreating the surface of the diamond includes steps of:

breaking carbon bonds at the surface of the diamond to create dangling bonds; and adding hydrogen atoms to the dangling bonds.

7. A method for fabricating a Schottky junction comprising diamond and a metal layer deposited directly on the diamond, the method comprising the steps of:

producing a halogen plasma by exciting a gas comprising $H_2$ and $CF_4$;

pretreating a surface of the diamond with the halogen plasma to change an original superlattice structure of the surface of the diamond to a normal lattice structure, the original superlattice structure having a first periodicity twice as long as a second periodicity of the normal lattice structure; and depositing the metal layer directly on the pretreated surface of the diamond to form the Schottky junction.

8. The method according to claim 7, wherein the step of pretreating the surface of the diamond includes steps of:

breaking carbon bonds at the surface of the diamond to create dangling bonds; and adding hydrogen atoms to the dangling bonds.

9. A method for fabricating a Schottky junction comprising diamond and a metal layer deposited directly on the diamond, the method comprising the steps of:

producing an oxygen plasma by exciting a gas comprising $H_2$ and $O_2$;

pretreating a surface of the diamond with the halogen plasma to change an original superlattice structure of the surface of the diamond to a normal lattice structure, the original superlattice structure having a first periodicity twice as long as a second periodicity of the normal lattice structure; and depositing the metal layer directly on the pretreated surface of the diamond to form the Schottky junction.

10. The method according to claim 9, wherein the step of pretreating the surface of the diamond includes steps of:

breaking carbon bonds at the surface of the diamond to create dangling bonds; and adding hydrogen atoms to the dangling bonds.

11. A method for fabricating a Schottky junction comprising the steps of:

producing a plasma by exciting a mixture of gas consisting of $H_2$ and $O_2$, 0.1 to 10 percent of a volume of the mixture of gas being $O_2$;

pretreating a surface of diamond with the plasma to change an original superlattice structure of the surface of the diamond to a normal lattice structure; and depositing Schottky electrodes directly on the pretreated surface of the diamond.

12. The method according to claim 11, wherein the step of pretreating the surface of the diamond includes steps of:

breaking carbon bonds at the surface of the diamond to create dangling bonds; and adding hydrogen atoms to the dangling bonds.

13. A method for fabricating a Schottky junction comprising diamond and a metal layer deposited directly on the diamond, the method comprising the steps of:

producing an oxygen plasma by exciting a gas comprising $H_2O$ and $CO_2$;

pretreating a surface of the diamond with the halogen plasma to change an original superlattice structure of the surface of the diamond to a normal lattice structure, the original superlattice structure having a first periodicity twice as long as a second periodicity of the normal lattice structure; and depositing the metal layer directly on the pretreated surface of the diamond to form the Schottky junction.

14. The method according to claim 13, wherein the step of pretreating the surface of the diamond includes steps of:

breaking carbon bonds at the surface of the diamond to create dangling bonds; and adding hydrogen atoms to the dangling bonds.

15. A method for fabricating a Schottky junction comprising diamond and a metal layer deposited directly on the diamond, the method comprising the steps of:

producing one of a halogen plasma and an oxygen plasma;

pretreating a surface of the diamond with the one of said halogen plasma and said oxygen plasma to change an original superlattice structure of the surface of the diamond to a normal lattice structure, the original superlattice structure having a first periodicity twice as long as a second periodicity of the normal lattice structure; and depositing the metal layer directly on the pretreated surface of the diamond to form the Schottky junction.

* * * * *